United States Patent
Hong

(10) Patent No.: US 9,362,276 B2
(45) Date of Patent: Jun. 7, 2016

(54) SEMICONDUCTOR DEVICE AND FABRICATION METHOD

(71) Applicant: Semiconductor Manufacturing International (Shanghai) Corporation, Shanghai (CN)

(72) Inventor: Zhongshan Hong, Shanghai (CN)

(73) Assignee: SEMICONDUCTOR MANUFACTURING INTERNATIONAL (SHANGHAI) CORPORATION, Shanghai (CN)

(*) Notice: Subject to any disclaimer, the term of this patent is extended or adjusted under 35 U.S.C. 154(b) by 0 days.

(21) Appl. No.: 14/671,460

(22) Filed: Mar. 27, 2015

(65) Prior Publication Data

US 2015/0318279 A1    Nov. 5, 2015

(30) Foreign Application Priority Data

May 4, 2014    (CN) .......................... 2014 1 0184425

(51) Int. Cl.
| | | |
|---|---|---|
| H01L 29/66 | (2006.01) | |
| H01L 27/088 | (2006.01) | |
| H01L 29/16 | (2006.01) | |
| H01L 29/161 | (2006.01) | |
| H01L 29/78 | (2006.01) | |
| H01L 21/8234 | (2006.01) | |
| H01L 21/3065 | (2006.01) | |
| H01L 21/308 | (2006.01) | |
| H01L 21/306 | (2006.01) | |
| H01L 21/02 | (2006.01) | |
| H01L 21/3105 | (2006.01) | |
| H01L 21/321 | (2006.01) | |
| H01L 21/762 | (2006.01) | |

(52) U.S. Cl.
CPC ........ *H01L 27/088* (2013.01); *H01L 21/02636* (2013.01); *H01L 21/308* (2013.01); *H01L 21/3065* (2013.01); *H01L 21/30604* (2013.01); *H01L 21/31053* (2013.01); *H01L 21/32115* (2013.01); *H01L 21/76224* (2013.01); *H01L 21/823437* (2013.01); *H01L 21/823481* (2013.01); *H01L 29/161* (2013.01); *H01L 29/1608* (2013.01); *H01L 29/66545* (2013.01); *H01L 29/7848* (2013.01)

(58) Field of Classification Search
CPC ..................... H01L 29/66545; H01L 29/1608; H01L 29/161; H01L 21/76224; H01L 21/823437
See application file for complete search history.

(56) References Cited

U.S. PATENT DOCUMENTS

| | | | | |
|---|---|---|---|---|
| 8,735,991 | B2* | 5/2014 | Shieh | H01L 21/823412 257/374 |
| 2009/0032843 | A1* | 2/2009 | Ohta | H01L 21/28052 257/190 |
| 2015/0270397 | A1* | 9/2015 | Peng | H01L 29/7848 257/190 |

*Primary Examiner* — Jose R Diaz
(74) *Attorney, Agent, or Firm* — Anova Law Group, PLLC

(57) ABSTRACT

Semiconductor devices and fabrication methods are provided. A semiconductor substrate is provided having dummy gate structures formed thereon. A stress layer is formed in the semiconductor substrate between adjacent dummy gate structures. A first dielectric layer is formed on the semiconductor substrate, the stress layers, and the sidewall spacers of the dummy gate structures, exposing dummy gate electrode layers. Gate structures are formed in the dielectric layer to replace the dummy gate structures. The gate structures include functional gate structures and at least one non-functional gate structure. The at least one non-functional gate structure is removed to form at least one second opening in the first dielectric layer. At least one third opening is formed in the semiconductor substrate at a bottom of the at least one second opening. A second dielectric layer is formed in the at least one second opening and the at least one third opening.

19 Claims, 7 Drawing Sheets

US 9,362,276 B2

SEMICONDUCTOR DEVICE AND FABRICATION METHOD

CROSS-REFERENCES TO RELATED APPLICATIONS

This application claims the priority of Chinese Patent Application No. 201410184425.2 filed on May 4, 2014, the entire content of which is incorporated herein by reference.

FIELD OF THE DISCLOSURE

The present disclosure relates to the field of semiconductor technology and, more particularly, relates to semiconductor devices and fabrication methods.

BACKGROUND

With rapid advances in semiconductor manufacturing technology, semiconductor devices are moving in the direction to have a higher component density and higher level of integration degree. As one of the most basic components of semiconductor devices, transistors are widely used. Meanwhile, the length of the gate of a transistor has become much smaller. However, a smaller gate length can often cause a short-channel effect in the transistor, and can further cause leakage current. As a result, performance of the transistors can be degraded.

Currently, performance of transistor is improved by increasing carrier mobility. When the carrier mobility is increased, the drive current of the transistor can be increased accordingly, and the leakage current can be suppressed. Since a key element to increase the carrier mobility is to increase the stress in the channel region of the transistor, the performance of the transistor can be improved by increasing the stress in the channel region.

A conventional method for improving the stress in the channel region of the transistor includes forming a stress layer in the source region and in the drain region. For example, the stress layer in a PMOS transistor can be made of SiGe. Since SiGe and Si have the same crystal structure (e.g. a "diamond" structure), SiGe can be grown directly on Si. Because the lattice constant of SiGe is greater than the lattice constant of Si at room temperature, lattice mismatch can be generated between the epitaxial SiGe and the Si. The SiGe stress layer can thus exert compressive stress to the channel region of the transistor. Accordingly, carrier mobility in the channel region of the PMOS transistor can be improved.

Similarly, the stress layer of a conventional NMOS can be made of SiC. At room temperature, the lattice constant of SiC is smaller than the lattice constant of Si, and lattice mismatch can be generated between Si and the epitaxial SiC. The SiC stress layer can thus exert tensile stress to the channel region of the NMOS transistor. Carrier mobility in the channel region of the NMOS transistor can be improved.

However, transistors having stress layers often have undesirable morphology and unstable electrical properties.

BRIEF SUMMARY OF THE DISCLOSURE

One aspect of the present disclosure provides a method for fabricating a semiconductor device. In this method, a semiconductor substrate is provided and a plurality of dummy gate structures is provided on the semiconductor substrate. Each dummy gate structure includes a dummy gate electrode layer and a sidewall spacer on a sidewall surface of the dummy gate electrode layer. A stress layer is formed in the semiconductor substrate between two adjacent dummy gate structures. A first dielectric layer is formed on the semiconductor substrate, the stress layers, and the sidewall spacers of the plurality of dummy gate structures. The first dielectric layer exposes the dummy gate electrode layers of the plurality of dummy gate structures. The dummy gate electrode layers are removed to form first openings in the first dielectric layer. Gate structures are formed in the first openings. The gate structures include a plurality of functional gate structures and at least one non-functional gate structure. The at least one non-functional gate structure is removed to form at least one second opening in the first dielectric layer. At least one third opening is formed in the semiconductor substrate at a bottom of the at least one second opening, and a second dielectric layer is formed to fill up the at least one second opening and the at least one third opening.

Another aspect of the present disclosure provides a semiconductor device. The semiconductor device includes a semiconductor substrate; a plurality of functional gate structures formed on the semiconductor substrate; and stress layers formed in the semiconductor substrate on opposite sides of each functional gate structure. The semiconductor transistor also includes a first dielectric layer on the semiconductor substrate, the stress layers, and sidewall spacers of each functional gate structure; and a second dielectric layer on the first dielectric layer and filled in an opening. The opening passes through the first dielectric layer and extends into the semiconductor substrate. Opposite sides of the opening connect to the stress layers in the semiconductor substrate.

To form the second dielectric layer of the semiconductor transistor, a plurality of dummy gate structures are formed on the semiconductor substrate, and a stress layer is formed between two adjacent dummy gate structures. Each dummy gate structure includes a dummy gate electrode layer and a sidewall spacer on a sidewall surface of each dummy gate electrode layer. To form the second dielectric layer, the first dielectric layer is formed on the semiconductor substrate, the stress layers, and the sidewall spacers of the plurality of dummy gate structures. The dummy gate electrode layers are removed to form first openings in the first dielectric layer. The first dielectric layer exposes the dummy gate electrode layers. Also, gate structures are formed in the first openings and the at least one non-functional gate structure is removed to form at least one second opening in the first dielectric layer. At least one third opening is formed in the semiconductor substrate at a bottom of the at least one second opening. The gate structures include the plurality of functional gate structures and at least one non-functional gate structure. The opening filled with the second dielectric layer includes the at least one second opening and the at least one third opening.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiment, persons of ordinary skill in the art may derive other embodiments consistent with the present disclosure, all of which are within the scope of the present invention.

Figure 1:
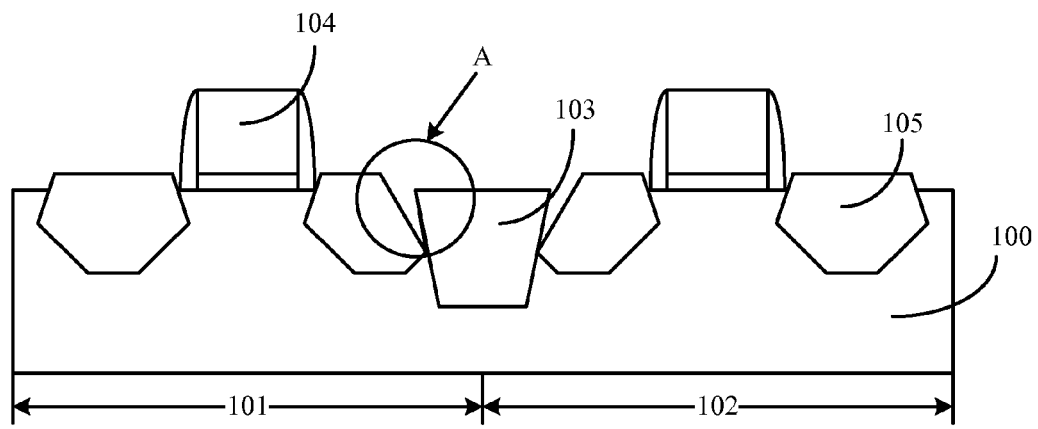
FIG. 1 is a cross-section illustration of a conventional transistor with a stress layer.

FIG. 1 illustrates a cross-section view of a transistor with stress layers (or stressors). The transistor includes: a substrate 100; a gate structure 104 on the substrate 100; and stress layers 105 in the substrate 100 on both sides of the gate structure 104. The substrate 100 includes a first region 101 and a second region 102. Shallow trench isolation (STI) structure 103 is located between the first region 101 and the second region 102.

To fabricate the stress layers 105, trenches are first formed in the substrate 100 on both sides of the gate structure 104. A selective epitaxial deposition process is used to form the stress layers 105 in the substrate 100. However, since the STI structures 103 are often formed before the formation of the gate structure 104, the STI structures 103 may jeopardize the formation of adjacent stress layers 105. Specifically, when the trenches are formed to be adjacent to the STI structures 103 and the sidewalls of the trenches expose portions of the STI structure 103, the deposition rate of the selective epitaxial deposition process on the sidewalls of the STI structures 103 can be zero.

In addition, the deposition rate of the selective epitaxial deposition process is at its lowest in the <111> crystal orientation. As a result, the stress layers 105 formed by this method may not able to fill up the trenches, and an angle (A) can be formed between a sidewall of the STI structure 103 and the surface of the stress layer 105 facing the sidewall. When conductive structures are subsequently formed on the surface of the stress layers 105, the angle A can result in voids, leading to poor electrical contact between the conductive structures and the stress layers 105.

In order to improve the morphology and electrical properties of the stress layers located adjacent to the STI structures, the present disclosure provides an exemplary transistor with stress layers and fabrication methods thereof. To fabricate the exemplary transistor, STI structures are formed after the formation of the stress layers to improve the morphology and electrical properties of the stress layers and to improve electrical stability of the transistor.

In one embodiment, to fabricate a transistor with stress layers, a substrate can be provided and can include a plurality of active regions and a plurality of isolation regions. For example, one isolation region can be disposed between adjacent active regions, or the active region and the isolation region can be alternated with one another. A plurality of dummy gate structures can be formed on the substrate surface of the isolation regions and the active regions. Each dummy gate structure includes a dummy gate electrode layer. Stress layers are formed. Each stress layer is formed in the substrate between two adjacent dummy gate structures.

A dielectric layer is formed over the substrate, the stress layers, and the dummy gate structures, and the dummy gate structures are exposed by the dielectric layer. The dummy gate electrode layers in the isolation regions are removed to form first openings in the dielectric layer. After the first openings are formed, the substrate at the bottom of the first openings is etched to form a second opening in the isolation region of the substrate connecting the bottom of each first opening. An isolation structure is then formed to fill up the first openings and the second openings in the isolation region.

When forming a transistor having a high-K dielectric layer and a metal gate (i.e., HKMG), a gate-last process can be used. After forming the isolation structure, a polishing process can be performed to polish the dielectric layer and to expose the polysilicon dummy gate electrode layer. The dummy gate electrode layers can then be removed to form third openings in the dielectric layer. A high-K dielectric layer is formed to fill up the third openings and to cover the surfaces of the dielectric layer and the isolation structures. Then, a metal film is formed on the surface of the high-K dielectric layer. The metal film and the high-K dielectric layer are planarized to leave a high-K dielectric layer and a metal gate in a third opening.

However, during the planarization process, residues of the metal film can remain on the surface of the isolation structure and cause leakage current between adjacent metal gate electrode layers. The electrical properties of the transistor can be adversely affected. In addition, before the formation of the third openings, additional steps may be needed to form the first openings, the second openings, and the isolation structures. As a result, processing time and cost of the fabrication may increase accordingly.

In order to reduce or eliminate remaining residues of the metal film on the isolation structure and to avoid the generated leakage current, in one embodiment, the disclosed semiconductor device can be formed, e.g., to include non-functional gate structures and functional gate structures. The functional gate structures may include dummy gate electrode layers. After the dummy gate electrode layers are removed to form the first openings, gate structures are formed in the first openings. The non-functional gate structures are then removed.

Second openings are formed in a dielectric layer, and third openings are further formed in the substrate at bottoms of second openings. Each third opening is connected to a second opening. The second dielectric layer is formed to fill up the second openings and the third openings. The second dielectric layer is used as the isolation structures to provide electrical isolation between portions of the substrate under adjacent gate structures of various semiconductor devices.

Since the formation of the second openings in the first dielectric layer and the formation of the third openings in the substrate are both after the formations of the gate electrode layers and the gate dielectric layers, no residues of gate electrode metal can remain on the surface of the isolation structures. Thus, the isolation structures formed using the disclosed fabrication method can provide more desirable electrical isolation and prevent/suppress leakage current between adjacent gate structures. Therefore, the semiconductor device can have more desirable electrical stability.

Figure 14:
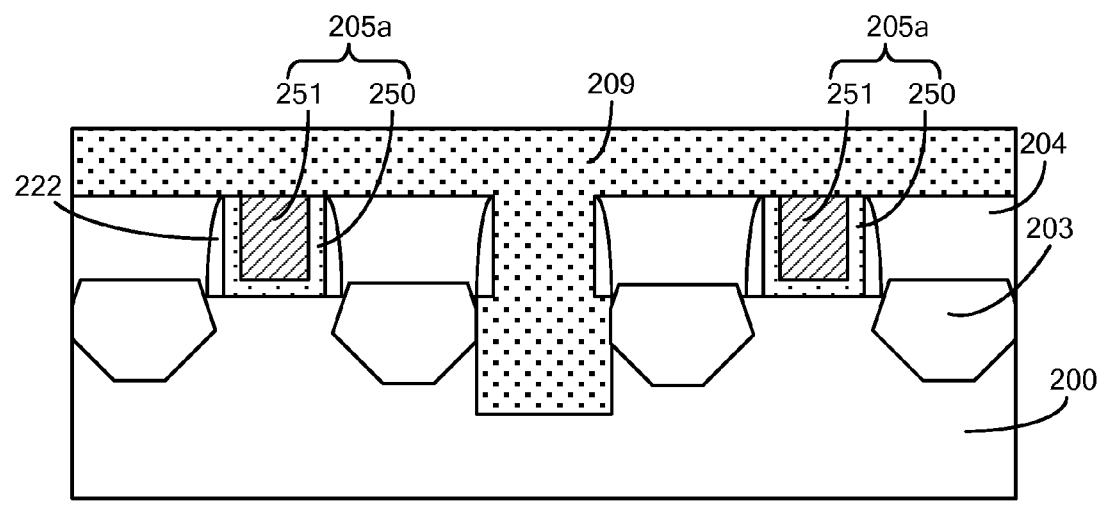
Figure 15:
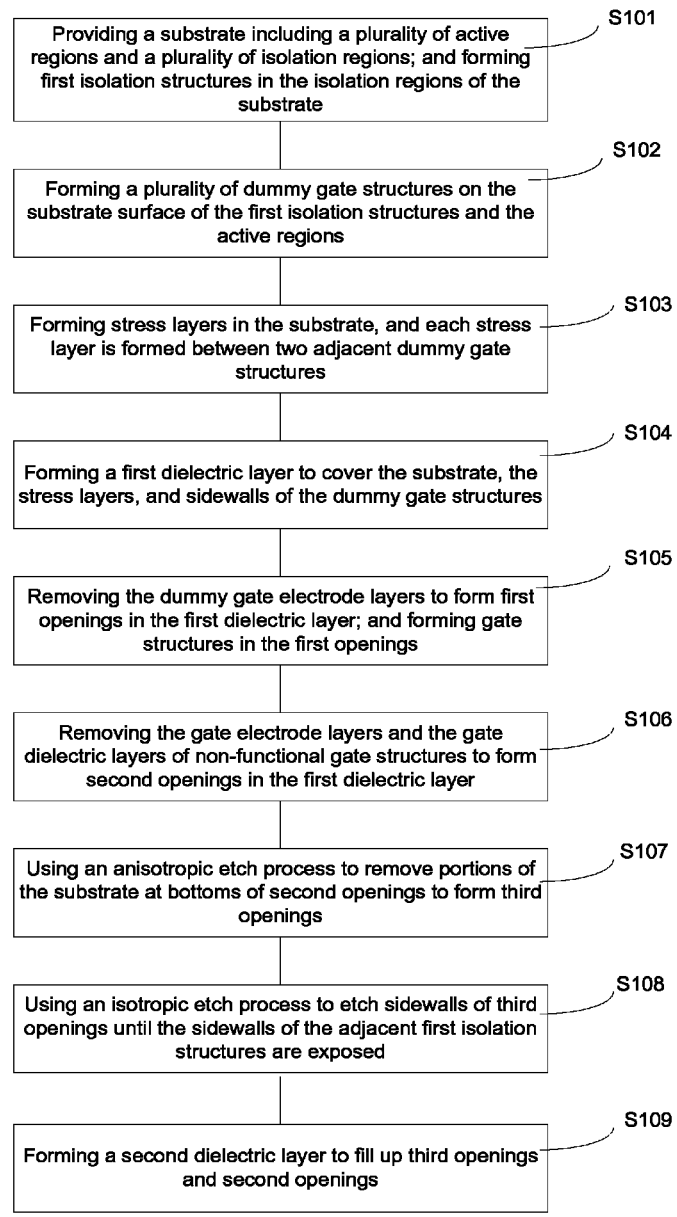
FIG. 15 illustrates an exemplary process of fabricating a transistor with stress layers consistent with various disclosed embodiments.

FIG. 15 illustrates an exemplary method of fabricating a transistor with stress layers, and FIGS. 2-14 illustrate exemplary transistor structures corresponding to various stages during the exemplary fabrication method consistent with various disclosed embodiments.

As shown in FIG. 15, at the beginning of the fabrication process, a substrate is provided. The substrate includes a plurality of active regions and a plurality of isolation regions. First isolation structures are formed in the isolation regions of the substrate (S101).

Figure 2:
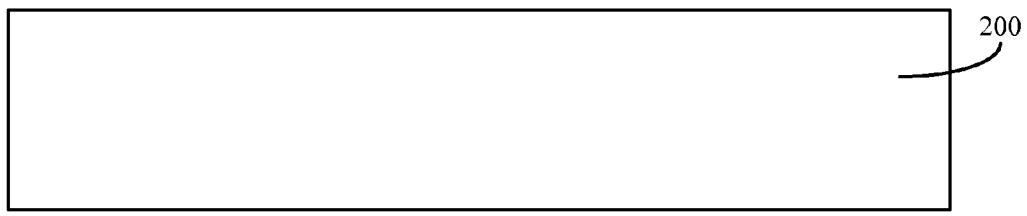
FIGS. 2-14 illustrate an exemplary transistor corresponding to certain stages of an exemplary fabrication process consistent with various disclosed embodiments.
Figure 3:
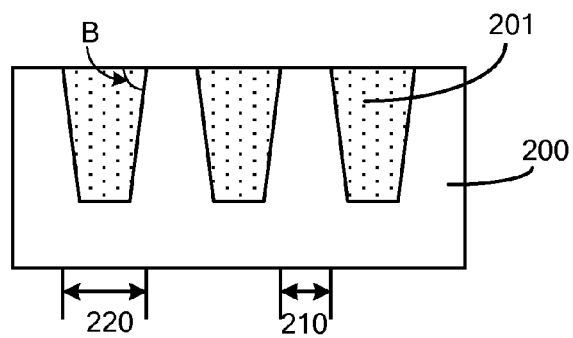
Figure 4:
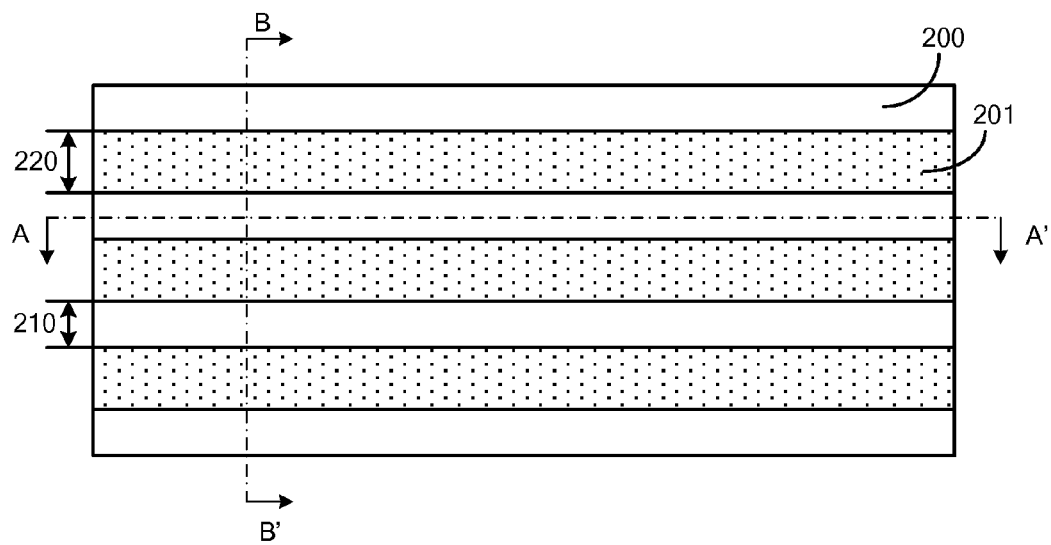

FIGS. 2, 3, and 4 illustrate a corresponding semiconductor structure. FIG. 4 is a top view of the semiconductor structure shown in FIGS. 2 and 3. FIG. 2 is a cross-section view of the semiconductor structure of FIG. 4 along an AA' direction. FIG. 3 is a cross-section view of the semiconductor structure of FIG. 4 along a BB' direction.

As shown in FIGS. 2, 3, and 4, a substrate 200 can be provided. The substrate 200 may include a plurality of active regions 210 and a plurality of isolation regions 220. One isolation region can be disposed between adjacent active regions, or the active region and the isolation region can be alternated with one another. For example, one isolation region 220 may be configured between adjacent active regions 210, and vice versa. Further, a first isolation structure 201 can be formed in the isolation region 220 of the substrate 200.

The substrate 200 can be made of Si, SiGe, SiC, Group III-V compounds (such as GaN or GaAs), and/or glass. In one embodiment, the substrate 200 can be made of Si. The Si substrate may have a crystal orientation of <100> or <110>.

The first isolation structure 201 can provide electrical isolation between active regions 210 in the substrate 200. The first isolation structure 201 can be made of $SiO_2$. To form the first isolation structures 201, a plurality of parallel trenches in the substrate 200 can first be formed. A layer of dielectric material can be formed to fill up the trenches in the substrate 200 and on a top surface of the substrate 200. The dielectric layer can then be planarized to expose the top surface of the substrate 200.

In one embodiment, a sidewall of the first isolation structure 201 can be inclined with respect to the top surface of the substrate 200. The top width of the first isolation structure 201 can be greater than the bottom width. In other words, the trenches formed in the substrate may have a tapered shape with a bottom width less than the top width. It may be easier to deposit the dielectric materials from the bottom of a trench, such that the first isolation structures 201 can be densely formed and voids inside the first isolation 201 can be avoided.

In one embodiment, a sidewall of a taper-shaped first isolation structure 201 can be in direct contact with the substrate 200, and the contacting sidewall can form an inclination angle B with respect to the top surface of the substrate 200. The inclination angle can be less than about 85 degrees.

In one embodiment, the top surface of a first isolation structure 201 can be below the top surfaces of the active regions 210 in the substrate 200 or be coplanar with the top surfaces of active regions 210 in the substrate 200. The subsequently-formed transistors in the active regions 210 can be planar transistors.

In another embodiment, the top surfaces of a first isolation structure 201 can be below the top surfaces of the active regions 210 in the substrate 200. Thus, the substrate portions in first isolation structures 201 can form fins with respect to the active regions 210. Accordingly, the subsequently-formed transistors in the active regions 210 can be FinFETs.

Figure 5:
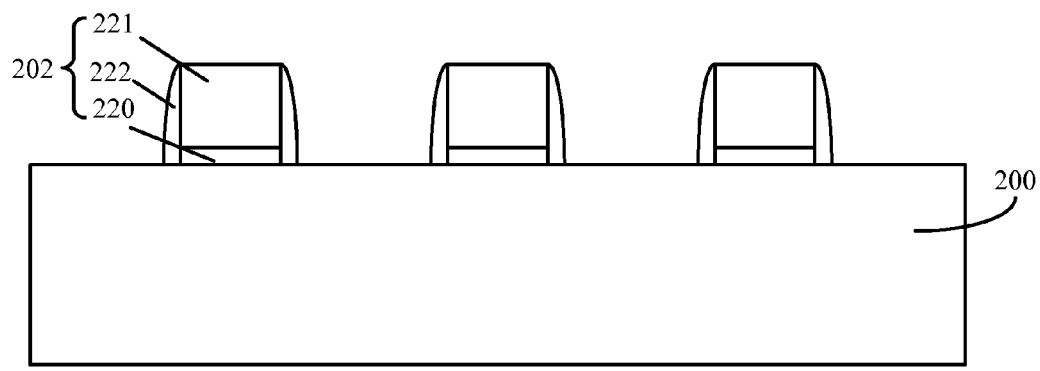

Returning to FIG. 15, after providing the substrate and forming the first isolation structures in the isolation regions of the substrate, a plurality of neighboring dummy gate structures are formed on substrate surface of the first isolation structures and the active regions (S102). FIG. 5 illustrates a corresponding semiconductor structure.

The semiconductor structure in FIG. 5 is provided in a same viewing direction as shown in FIG. 2. As shown in FIG. 5, a plurality of dummy gate structures 202 are formed on the substrate surface of the first isolation regions 201 and on active regions 210. The dummy gate structure 202 may include a dummy gate electrode layer 221 and a sidewall spacer 222 on the sidewall of the dummy gate electrode layer 221.

In one embodiment, the subsequently-formed transistors can be High-K Metal Gate (HKMG) transistors. A gate-last process can be used in the transistor fabrication. The dummy gate structures 202 can be formed on the substrate surface of the active regions 210 before the formations of source regions and drain regions.

For example, a dummy gate electrode layer 221 can be made of polysilicon. A sidewall spacer 222 can be made of one or more of $SiO_2$, $Si_3N_4$, and silicon oxynitride. In one embodiment, the dummy gate structure 202 may further include a dummy gate dielectric layer 220 located between the dummy gate electrode layer 221 and the substrate 200. The dummy gate dielectric layer can be made of $SiO_2$. In another embodiment, the dummy gate electrode layer 221 can be formed directly on the substrate 200.

In an embodiment, a gate dielectric layer may be formed between a dummy gate dielectric layer 220 and the corresponding dummy gate electrode layer 221. The gate dielectric layer can be made of a high-K dielectric material. After the dummy gate electrode layer 221 is removed, the corresponding gate dielectric layer can be exposed.

In another embodiment, the gate dielectric layer can be formed on the substrate 200, and the dummy gate electrode layer 221 can be formed on the gate dielectric layer. That is, the gate dielectric layer can be formed between the substrate 200 and the corresponding dummy gate electrode layer 221. The gate dielectric layer can be made of a high-K dielectric material. After the removal of the dummy gate electrode layer 221, the gate dielectric layer can be exposed.

To form a dummy gate structure, a dummy gate dielectric film can be formed on the substrate surface of the first isolation structures 201. A dummy gate electrode film can be formed on the dummy gate dielectric film. A second mask layer can be formed on the dummy gate electrode film to define the locations and pattern of the subsequently-formed gate structures. The second mask layer can be used as the etch mask to etch the dummy gate electrode film and the dummy gate dielectric film to expose the substrate 200 and surfaces of the first isolation structures 201. The dummy gate dielectric layer 220 and the dummy gate electrode layer 221 can be formed.

A sidewall layer can be deposited on the substrate 200, the first isolation structures 201, the dummy gate dielectric layer 220, and the dummy gate electrode layer 221. The sidewall layer can be etched back to expose portions of the substrate 200, the surfaces of the first isolation structures 201, and the second mask layer to form a sidewall spacer 222. In one embodiment, the top surfaces of the first isolation structures 201 can be coplanar with the top surface of the substrate 200.

In another embodiment, the top surfaces of the first isolation structures 201 can be below the top surfaces of the active region 210 in the substrate 200, such that portions of substrate 200 between the first isolation regions 201 can form fins. Accordingly, a dummy gate structure can be formed on a first isolation region. A dummy gate structure 202 can also be formed on the sidewalls and top surfaces of adjacent fins.

Figure 6:
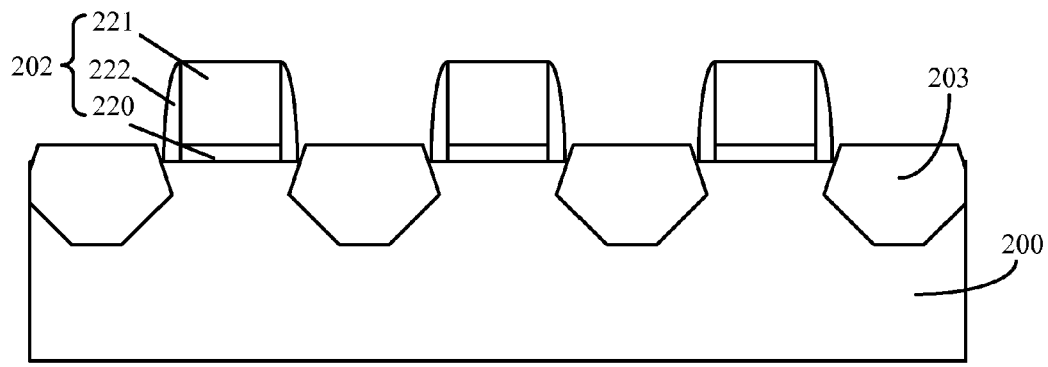

Returning to FIG. 15, after forming a plurality of adjacent dummy gate structures on the substrate, stress layers are formed in the substrate. A stress layer is formed between two adjacent dummy gate structures (8103). FIG. 6 illustrates a corresponding semiconductor structure.

As shown in FIG. 6, a stress layer 203 can be formed in the substrate 200 between two adjacent dummy gate structures 202 or on both sides of one dummy gate structure 202.

The stress layers can be made of, e.g., SiGe or SiC. When the subsequently-formed transistor is a PMOS transistor, the stress layer can be made of SiGe. When the subsequently-formed transistor is a NMOS transistor, the stress layer can be made of SiC.

To form a stress layer 203, a fourth opening can be formed in the substrate 200 between adjacent dummy gate structures 202. A selective epitaxial deposition can later be used to form the stress layer 203 in the fourth openings.

To fabricate a fourth opening in the substrate 200, an anisotropic dry etch process can be used to form the fourth opening in the substrate 200 between two adjacent dummy gate structures 202. During the anisotropic dry etch process, the second mask layer and sidewall spacer 222 can protect adjacent dummy gate structures 221. A sidewall of the fourth opening can be vertical with respect to the tp surface of the substrate 200.

In one embodiment, a stress layer 203 can be formed directly after the formation of a fourth opening. In one embodiment, the substrate 200 can be made of Si. The parameters of the anisotropic dry etch process to etch the substrate 200 may include: an etchant gas of $Cl_2$, HBr, and/or a mixture of $Cl_2$ and HBr, a flow rate of HBr of about 200 sccm to about 800 sccm; and a flow rate of $Cl_2$ of about 20 sccm to about 100 sccm. An inert gas can also be included in the dry etch process having a flow rate of about 50 sccm to about 1000 sccm. In addition, the pressure in the etch chamber can be about 2 mTorr to about 200 mTorr, and the etching time can be about 15 seconds to about 60 seconds.

In one embodiment, after the anisotropic dry etch process, an anisotropic wet etch process can also be used to etch the sidewalls of the fourth openings to form a vertex angle on each sidewall against the substrate. Each vertex angle can be configured to extend to under the bottom of a corresponding or adjacent dummy gate structure 202. Thus, each sidewall of the fourth opening can form a "Σ" shape with respect to the top surface of the substrate. The "Σ" shaped sidewalls of a fourth opening can reduce the distance from the stress layer to the adjacent channel region and thus provide higher stress for the adjacent channel region. Accordingly, the carrier mobility in the channel region can be increased and the leakage current can be suppressed.

Specifically, since the etch rate of the anisotropic wet etch process can be the lowest in the <111> crystal orientation, the vertex angle on each sidewall of the fourth openings can thus be formed by using the wet etch process.

In one embodiment, the substrate 200 can be made of Si. The anisotropic wet etch process can include an etching solution, e.g. an alkaline solution. The alkaline solution can be one or more of a potassium hydroxide (KOH) solution, a sodium hydroxide (NaOH) solution, a lithium hydroxide (LiOH) solution, an aqueous ammonia ($NH_4OH$) solution, and/or a tetramethyl ammonium hydroxide (TMAH) solution.

The stress layers 203 can be formed by using a selective epitaxial deposition process. The deposited stress layers 203 can be lattice-mismatched to the substrate to provide stress to the substrate 200. The parameters of the selective epitaxial deposition process may include: a deposition temperature at about 500 degrees Celsius to about 800 degrees Celsius; a deposition pressure of about 1 Torr to about 100 Torr; and a deposition gas.

The deposition gas can be a silicon-containing source gas (e.g. $SiH_4$ and/or $SiH_2Cl_2$), a germanium-containing source gas (e.g. $GeH_4$), and/or a carbon-containing source gas (e.g., $CH_4$, $CH_3Cl$, and/or $CH_2Cl_2$). The flow rate of the deposition gas (e.g. the silicon-containing source gas, the germanium-containing source gas, or the-containing carbon source gas) can be about 1 sccm to about 1000 sccm. In addition, the deposition gas can also include HCl and $H_2$. The flow rate of the HCl can be about 1 sccm to about 1000 sccm, and the flow rate of the $H_2$ can be about 0.1 sccm to about 50 sccm.

Additionally, P-type dopants or N-type dopants may be doped into the stress layers 203, to form a source region in the substrate on one side of a dummy gate structure 202 and a drain region in the substrate on the other side of the dummy gate structure 202. In an embodiment, in situ doping may be used to dope the dopants into the stress layers 203 during the selective epitaxial deposition process. In another embodiment, an ion implantation process may be used to dope the dopants into the stress layers after the selective epitaxial deposition process.

In one embodiment, since no STI structures are to be formed in the substrate 200 between adjacent dummy gate structures 202, the formation of stress layers 203 may not be jeopardized during the selective epitaxial deposition process. Thus, the stress layers 203 can fill up the fourth openings, and the stress layers 203 can have desirable morphology and uniform structures.

Figure 7:
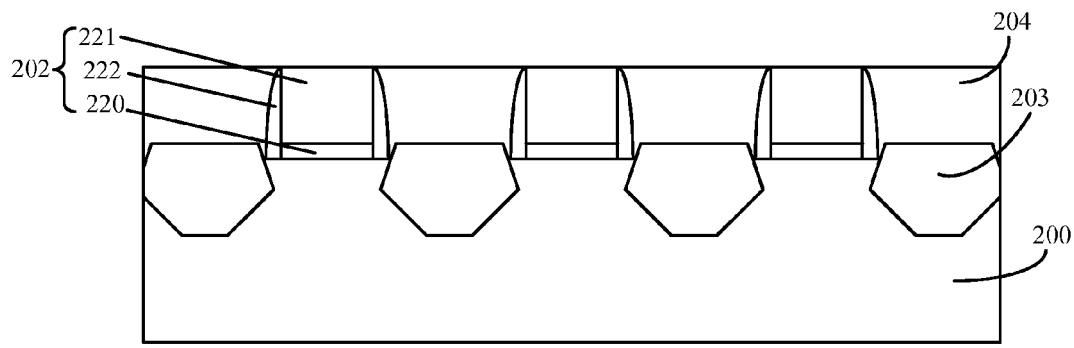

Returning to FIG. 15, after forming the stress layers, a first dielectric layer is formed to cover the substrate, the stress layers, and the sidewalls of the dummy gate structures (S104). FIG. 7 illustrates a corresponding semiconductor structure.

As shown in FIG. 7, the first dielectric layer 204 can be formed to cover the substrate 200, the stress layers 203, and the sidewalls of the dummy gate structures 202. The first dielectric layer 204 can be configured to expose the dummy gate electrode layers 221.

The first dielectric layer 204 can be made of $SiO_2$ or a low-K dielectric material. The first dielectric layer 204 can maintain the shapes and positions of the dummy gate electrode layers 221. The first dielectric layer 204 can also be used to provide electrical isolation between the subsequently-formed gate structures and other conductive structures.

To form the first dielectric layer 204, a first dielectric film can be formed on the substrate 200, the stress layers 203, and the dummy gate structures 202. The first dielectric film can be planarized to expose the top surfaces of the dummy gate electrode layers 221. The first dielectric layer 204 can thus be formed.

In various embodiments, the first dielectric film can be formed by a chemical vapor deposition process or a physical vapor deposition process. The planarization process can be a chemical mechanical polishing process. The chemical mechanical polishing process can be performed to first expose the second mask layer, and then expose the top surfaces of the dummy gate electrode layers 221 such that the second mask layer can be removed.

Figure 8:
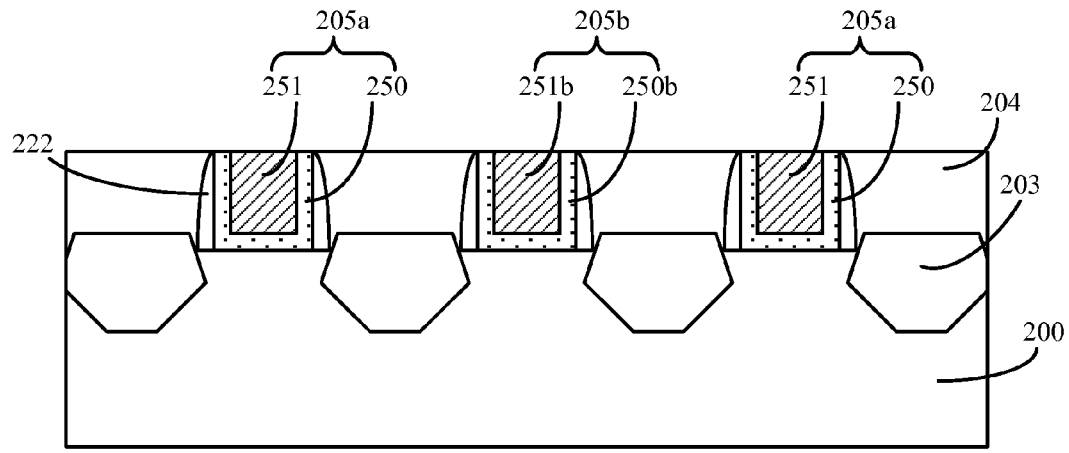

Returning to FIG. 15, after forming the first dielectric layer, dummy gate electrode layers are removed to form first openings in the first dielectric layer. Gate structures are formed in the first openings (S105). FIG. 8 illustrates a corresponding semiconductor structure.

As shown in FIG. 8, dummy gate electrode layers 221 (as shown in FIG. 7) can be removed to form first openings in the first dielectric layer 204. Gate structures can be formed in the first openings. The gate structures may include a plurality of functional gate structures 205a, and at least one non-functional gate structure 205b.

A gate structure can include a gate dielectric layer 250 and a gate electrode layer 251. The gate electrode layer 251 can be formed on the gate dielectric layer 250 to fill up a corresponding first opening. The gate dielectric layer 250 can be made of a high-K dielectric material. The high-K material can be one or more of $HfO_2$, HfSiO, HfSiON, HfTaO, HfZrO, $Al_2O_3$, and $ZrO_2$. The gate electrode layer 251 can be made of a metal including Al, Cu, and/or Ti.

In one embodiment, dummy gate dielectric layers 220 (as shown in FIG. 7) can be made of $SiO_2$. After the removal of the dummy gate electrode layers 221, dummy gate dielectric layers 220 may also be removed to expose the substrate 200 at the bottoms of the first openings.

To form a gate structure, a gate dielectric film can be formed first to cover the first dielectric layer 204 and the first opening, and a gate electrode film can be formed on the gate dielectric film to fill up the first opening. The gate electrode film and the gate dielectric film can be planarized to expose surface of the first dielectric layer 204. Thus, a gate dielectric layer 250 can be formed on the sidewalls and the bottom of the first opening, and a gate electrode layer 251 can be formed on the gate dielectric layer 250.

The gate dielectric film and the gate electrode film can be formed by using a chemical vapor deposition process or a physical vapor deposition process. The planarization process can be a chemical mechanical polishing process or an etch back process. In one embodiment, a chemical mechanical polishing process can be used. However, metal residues may be left on the surface of the first dielectric layer 204 after the chemical mechanical polishing process to cause leakage current between adjacent gate electrode layers 251.

In one embodiment, the gate structures may include functional gate structures 205a and non-functional gate structures 205b. The functional gate structures 205a can be configured to form transistors, and a non-functional gate structures 205b can be configured to define the space required for a subsequently-formed second dielectric layer. The second dielectric layer can be formed in the substrate 200 at the bottom of the non-functional gate structure 205b. Since the second dielectric layer can be formed after the formation of the gate electrode layers 251, metal residues remained on the surface of the second dielectric layer can be avoided. Thus, the second dielectric layer to be formed can provide desirable electrical isolation.

In another embodiment, a gate dielectric layer may be formed between the substrate 200 and a dummy gate dielectric layer. The gate dielectric layer can be exposed after the removal of the dummy gate dielectric layer. To form a gate structure, a gate electrode film can be formed to cover the surface of the first dielectric layer 204 and the first opening. The gate electrode film can be planarized to expose the portions of the surface of the first dielectric layer 204. The gate electrode layer 251 can thus be formed in the first opening.

Figure 9:
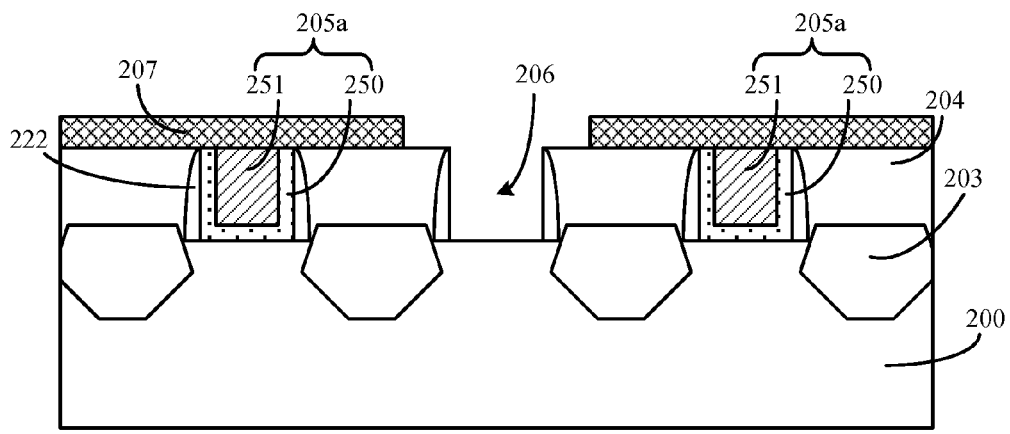

Returning to FIG. 15, after removing the dummy gate electrode layers to form first openings in the first dielectric layer and to form gate structures in the first openings, gate electrode layers and gate dielectric layers of the non-functional gate structures are removed. Second openings are formed through the first openings (S106). FIG. 9 illustrates a corresponding semiconductor structure.

As shown in FIG. 9, gate electrode layers 251 and gate dielectric layers 250 of the non-functional gate structures 205b (shown in FIG. 8) can be removed. Second openings 206 can be formed through the first openings 204 and underneath the first openings 204.

To form the second opening 206, a first mask layer 207 can be formed on the first dielectric layer 204 to expose the non-functional gate structures 205b. The first mask layer 207 can then be used as the etch mask to etch the gate electrode layer 251b and gate dielectric layer 250b of a non-functional gate structure 205b to form a second opening 206. In one embodiment, the first mask layer 207 may also expose portions of the first dielectric layer 204 adjacent to the gate electrode layer 251b. However, since the etching of the gate metal 251b can be selective over the first dielectric layer 204, the first dielectric layer 204 may not be damaged during the etching of the metal gate layer 251b.

In one embodiment, a wet etch process may be used to remove the gate electrode layer 251b and the gate dielectric layer 250b. The wet etch process can have desirable etching selectivity over the first dielectric layer 204, and may cause very little damage to the surface of the first dielectric layer 204. The gate electrode layer 251b can be made of metal. The gate dielectric layer 250b can be made of a high-K dielectric material. The etchant solution of the wet etch process can be an acidic solution. For example, when the gate electrode layer 251b is made of Al, the etchant solution can contain phosphoric acid.

In another embodiment, an isotropic dry etch process can also be used to remove the gate electrode layer 251b and the gate dielectric layer 250b. The isotropic dry etch process can cause very little damage to the exposed portions of the first dielectric layer 204. An etchant gas of the dry etch process can include $Cl_2$ and/or $BCl_3$.

Figure 10:
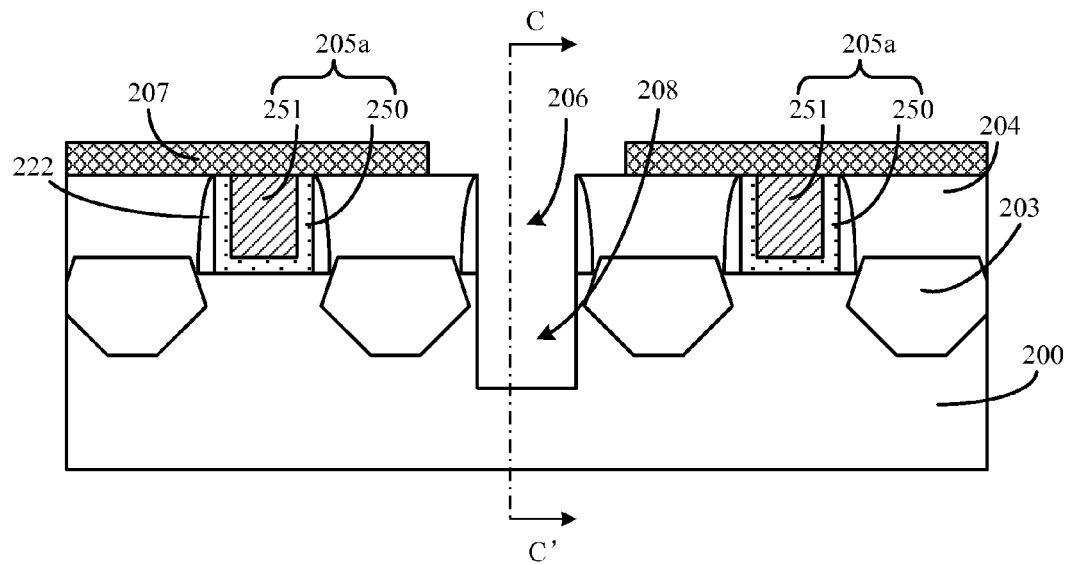
Figure 11:
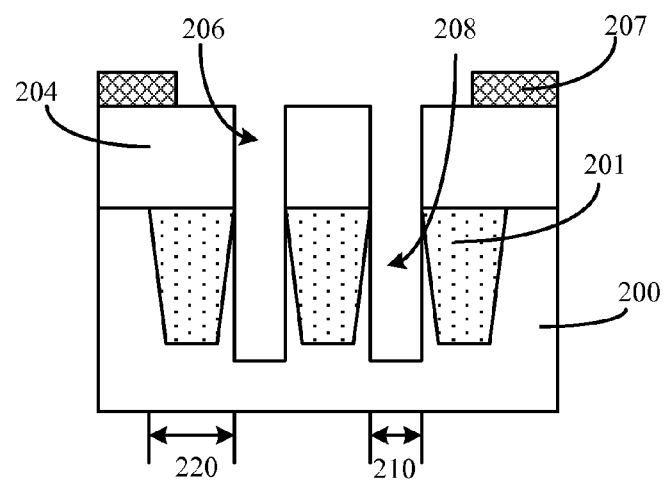

Returning to FIG. 15, after removing the gate electrode layers and gate dielectric layers of the non-functional gate structures and after forming the second openings 206 in the first dielectric layer 204, an anisotropic etch process is used to remove portions of the substrate at bottoms of the second openings to form third openings (S107). FIGS. 10 and 11 illustrate a corresponding semiconductor structure.

FIG. 11 is a cross-section view of the semiconductor structure of FIG. 10 along a CC' direction. As shown in FIGS. 10 and 11, an anisotropic etch process can be used to remove the portion of the substrate 200 at bottoms of second openings 206 to form third openings 208 in the substrate 200.

In one embodiment, the substrate 200 can be made of silicon. The anisotropic etch process can be a dry etch process. The etchant gas can be a fluorine-based gas and/or a chlorine-based gas. The etching bias power can be higher than about 100 W. By using such anisotropic dry etch, a sidewall of a third opening 208 can be vertical with respect to the top surface of the substrate 200.

The stress layer 203 is in the substrate 200 including at least one side of a third opening 208. In one embodiment, the stress layer 203 can be formed in the substrate on each of the two sides of the third opening 208. The stress layers 203 on the two sides of the third opening 208 may be made of a same material, such as SiGe. In another embodiment, the stress layer 203 can be formed in the substrate on each of the two sides of the third opening 208. The stress layers 203 on the two sides of the third opening 208 may be made of a different material. In various embodiments, the stress layer can be made on only one side of the third opening 208.

As disclosed, in one embodiment, a sidewall of the first isolation structure 201 can be inclined with respect to the top surface of the substrate 200, and the top width of the first isolation structure 201 can be greater than the bottom width. In other words, the top width of the substrate portion between adjacent first isolation structures 201 may be smaller than the bottom width of the substrate portion between adjacent first isolation structures 201. When a sidewall of the third opening 208 is formed to be substantially perpendicular to the top surface of the substrate 200, a portion of substrate 200 may remain between the sidewall of the third opening 208 and the sidewall of the adjacent first isolation structure 201, as shown in FIG. 11.

The portion of the substrate 200 remaining between sidewalls of the third opening 208 and the adjacent first isolation structure 201 can cause leakage current between active regions 210 under adjacent functional gate structures 205a. Thus, after the anisotropic dry etch process, an isotropic etch process may also be performed to remove the portion of the substrate 200 remaining between sidewalls of the third opening 208 and the adjacent first isolation structure 201 and to expose adjacent first isolation structures 201 on both sidewalls of the third opening 208 as described below in FIGS. 12-13.

Since the isotropic etch process may be performed after the anisotropic etch process, the thickness of the portions of the substrate to be removed by the isotropic etch process can be sufficiently small. Thus, etching damages caused by the isotropic etch process on the stress layers 203 on both sides of a third opening 208 can be avoided.

Figure 12:
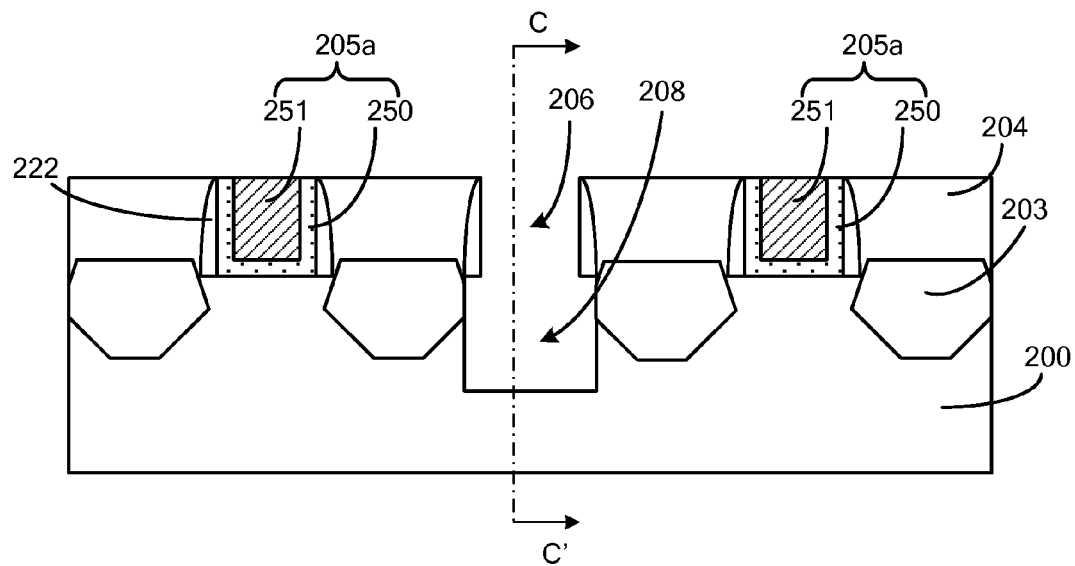
Figure 13:
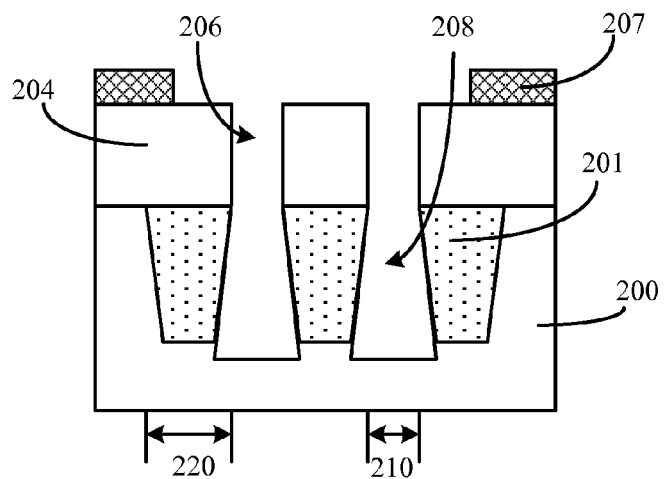

Returning to FIG. 15, after using the anisotropic etch process to remove portions of the substrate at bottoms of second openings to form third openings 208, an isotropic etch process is performed to etch the sidewalls of the third openings until the sidewalls of adjacent first isolation structures are exposed (S108). FIGS. 12 and 13 illustrate a corresponding semiconductor structure.

FIG. 13 is a cross-section view of the semiconductor structure of FIG. 12 along a CC' direction. As shown in FIGS. 12 and 13, an isotropic etch process can be performed to etch the sidewalls of a third opening 208 until the sidewalls of adjacent first isolation structures 201 on both sides of the third opening 208 are exposed.

The isotropic etch process may have an etch rate in all directions and thus can etch substrate 200 in all directions. The portions of the substrate 200 between sidewalls of the third opening 208 and the adjacent first isolation structures 201 can be removed and the sidewalls of the adjacent first isolation structures 201 can be exposed to the third opening 208. A second dielectric layer can be subsequently formed in the third opening 208 and be in direct contact with the adjacent first isolation structures 201 on both side of the third opening 208. Thus, complete electrical isolation can be provided between active regions 210 under adjacent functional gate structure 205a, and leakage current can be prevented/suppressed between adjacent active regions 210.

In one embodiment, after the isotropic etch process, the third opening 208 may also expose portions of the adjacent stress layers 203 as shown in FIG. 12. The exposed surface of the stress layer 203 and the surface of the corresponding sidewall of the third opening 208 can be coplanar with each other.

In an embodiment, the isotropic etch process can be a wet etch process. The etchant solution can be a TMAH solution, a NH$_4$OH solution, and/or a KOH solution.

In another embodiment, the isotropic etch process can be a dry etch process. The etchant gas can include a fluorine-based gases and/or a chlorine-based gas. The etching power can be less than about 100 W. The etching bias can be less than about 10 V. For example, the fluorine-based gas can include SF$_6$, CF$_4$, and/or NF$_3$; and the chlorine-based gas can include Cl$_2$ and/or BCl$_3$.

In one embodiment, the isotropic etch process can further remove the first mask layer 207 (shown in FIG. 10) to expose the surface of the first dielectric layer 204. The subsequently-formed second dielectric layer can be formed on the first dielectric layer 204 and the gate electrode layer 251 to protect the functional gate structures 205a. Adjacent functional gate structures 205a are electrically isolated.

In one embodiment, since a chemical mechanical polishing process may be used in the formation of the gate electrode layers 251, metal residues left from the chemical mechanical polishing process may remain on surface of the first dielectric layer 204. The isotropic etch process can be used to remove the metal residue remained on the first dielectric layer 204. Thus, leakage current between adjacent gate structures 205a can be further prevented/l suppressed.

Returning to FIG. 15, after using the isotropic etch process to etch sidewalls of third openings to expose sidewalls of adjacent isolation structures, a second dielectric layer is formed to fill up third openings and second openings (S109). FIG. 14 illustrates a corresponding semiconductor structure.

As shown in FIG. 14, a second dielectric layer 209 can be formed to fill up second openings 206 and third openings 208.

The second dielectric layer 209 can be made of one or more of SiO$_2$, Si$_3$N$_4$, silicon oxynitride, and other low-K dielectric materials. The second dielectric layer 209 can be formed by a chemical vapor deposition process or a physical vapor deposition process. Since the second dielectric layer 209 is configured to fill up second openings 206 and third openings 208, a dense dielectric material may be desired. The method for forming the second dielectric layer can include a high aspect ratio deposition process (HARP), a high density plasma (HDP) deposition process, and/or a flowable chemical vapor deposition (FCVD) process to ensure the second dielectric layer 209 to be densely formed.

In one embodiment, the second dielectric layer 209 can be formed on the functional gate structures 205a and the first dielectric layer 204. The second dielectric layer 209 can also protect and electrically isolate adjacent gate electrode layers 251. In addition, since the second dielectric layer 209 can be formed on the first dielectric layer 204, no additional dielectric layer needs to be formed between the gate electrode layers 251 and the first dielectric layer 204. Thus, the fabrication process of the semiconductor can be simplified.

Further, after the formation of the second dielectric layer 209 by a deposition process, a chemical mechanical polishing process can be performed to polish the surface of the second dielectric layer 209. Since the second dielectric layer 209 can be formed on the first dielectric layer 204, the chemical mechanical polishing process may not be able to directly polish the surfaces of the first dielectric layer 204 and the gate electrode layers 251. Thus, damages to the surfaces of the first dielectric layer 204 and the gate electrode layers 205 caused by the polishing process can be prevented.

In one embodiment, isolation in a gate length direction of the formed transistor devices can be provided by filling the second dielectric layer 209 (or any interlayer dielectric layer) in the openings 206 and 208, after a polishing process (e.g., chemical mechanical polishing) of metal gate as shown in FIGS. 7-8. As such, stress profile of the exemplary SiGe or SiC stress layer can be improved and metal residues can also be eliminated.

In one embodiment, the first openings can be formed after the removal of the dummy gate electrode layers, and gate structure can be formed in the first openings. The gate electrode layers and the gate dielectric layers of the non-functional gates can be removed. Second openings can be formed in the first dielectric layer, and third opening can be formed in the substrate connecting to the second openings. The second dielectric layer can be formed to fill up second openings and third openings and provide electrical isolation between substrate portions under gate structures of adjacent transistors. Since second openings can be formed in the first dielectric layer after the formations of the gate electrode layers and gate dielectric layers, and third openings can be in the substrate, metal residues remained on the first dielectric layer 204 can be avoided. Therefore, the isolation structure formed by using the method disclosed herein can provide desirable electrical isolation and suppress leakage current between adjacent functional gate structures. The semiconductor structures can have desirable electrical stability.

Compared to a conventional transistor, the fabrication methods provided in the present disclosure has the following advantages. For example, firstly, first openings are formed after the removal of the dummy gate electrode layers, followed by forming gate structures in the first openings. Non-functional gate structures are then removed. Secondly, second openings are formed in the first dielectric layer, and third openings are formed in the substrate connecting to the second openings. Further, the second dielectric layer is formed to fill up second openings and third openings and to provide electrical isolation between portions of substrate under adjacent transistors. Because second openings are formed in the first dielectric layer, and third openings are formed in the substrate, metal residues remained on the isolation structure can be prevented. Thus, the isolation structures can provide more desirable electrical isolation between adjacent functional gate structures to prevent/suppress leakage current. The electrical stability of the semiconductor device can be improved.

Further, the substrate includes a plurality of active regions and a plurality of isolation regions configured in parallel in the substrate. One isolation region is configured between adjacent active regions, and vice versa. Isolation structures are formed in the isolation regions, and dummy gate structures are formed on the substrate surface of the isolation structures and the active regions. The etching process to remove the portion of substrate at the bottom of a second opening includes an anisotropic etching process and an isotropic etching process. For example, by using the anisotropic dry etch process, the sidewalls of a third opening are vertical with respect to the top surface of the substrate. However, substrate material may not be completely removed between a sidewall of the third opening and a sidewall of the adjacent isolation structure. Thus, the isotropic etching process is performed to remove the remaining substrate material between a sidewall of the third opening and a sidewall of the adjacent isolation structure until the sidewall of the isolation structure is exposed to the third opening. That is, the subsequently-formed second dielectric layer is in direct contact with adjacent isolation structures in the third opening. Accordingly, adjacent functional gate structures are electrically isolated by the second dielectric layer completely, and leakage current between bottoms of adjacent gate structures through the substrate can be avoided. Therefore, the semiconductor devices fabrication in this method can have desirable electrical stability.

Other embodiments of the disclosure will be apparent to those skilled in the art from consideration of the specification and practice of the invention disclosed herein. It is intended that the specification and examples be considered as exemplary only, with a true scope and spirit of the invention being indicated by the claims.

The invention claimed is:

1. A method for fabricating a semiconductor device, comprising:
    providing a semiconductor substrate including a plurality of active regions configured in parallel and an isolation region between adjacent active regions;
    forming isolation structures in the isolation regions;
    providing a plurality of dummy gate structures on the isolation structures and the active regions that are in the semiconductor substrate, wherein each dummy gate structure includes a dummy gate electrode layer and a sidewall spacer on a sidewall surface of the dummy gate electrode layer;
    forming a stress layer in the semiconductor substrate between two adjacent dummy gate structures;
    forming a first dielectric layer on the semiconductor substrate, the stress layers, and the sidewall spacers of the plurality of dummy gate structures, wherein the first dielectric layer exposes the dummy gate electrode layers of the plurality of dummy gate structures;
    removing the dummy gate electrode layers to form first openings in the first dielectric layer;
    forming gate structures in the first openings, wherein the gate structures include a plurality of functional gate structures and at least one non-functional gate structure;
    removing the at least one non-functional gate structure to form at least one second opening in the first dielectric layer;
    forming at least one third opening in the semiconductor substrate at a bottom of the at least one second opening; and
    forming a second dielectric layer to fill up the at least one second opening and the at least one third opening.

2. The method according to claim 1, wherein the step of forming the at least one third opening at the bottom of the at least one second opening includes an etching process including:
    using the first dielectric layer as an etch mask to etch the semiconductor substrate at the bottom of the at least one second opening to form the at least one third opening.

3. The method according to claim 2, wherein the etching process includes:
    using an anisotropic etch process to etch the semiconductor substrate at the bottom of the at least one second opening to form the at least one third opening; and
    using an isotropic etch process to etch sidewalls of the at least one third opening to expose sidewalls of an adjacent isolation structure in the semiconductor substrate.

4. The method according to claim 3, wherein:
    the anisotropic etch process is a dry etch process using an etchant gas including a fluorine-based gas, a chlorine-based gas, or a combination thereof, wherein an etching power is higher than about 100 W.

5. The method according to claim 3, wherein:
    the isotropic etch process is a wet etch process using an etchant solution including a tetramethyl ammonium hydroxide (TMAH) solution, a aqueous ammonia (NH$_4$OH) solution, a potassium hydroxide (KOH) solution, or a combination thereof.

6. The method according to claim 3, wherein:
    the isotropic etch process is a dry etch process;
    an etchant gas includes a fluorine-based gas, a chlorine-based gases, or a combination thereof;
    an etching power is less than about 100 W; and
    an etching voltage is less than about 10 V.

7. The method according to claim 1, wherein:
    a sidewall of the isolation structure contacting the semiconductor substrate is inclined with respect to a top surface of the semiconductor substrate to make an angle, wherein the angle is less than about 85 degrees; and
    a top width of the isolation structure is greater than a bottom width within the semiconductor substrate.

8. The method according to claim 1, wherein a top surface of the isolation structure is below or coplanar with a top surface of the active regions in the semiconductor substrate.

9. The method according to claim 8, wherein:
the top surface of the isolation structure is below the top surface of the active regions in the semiconductor substrate, such that a fin is formed by a portion of the semiconductor substrate between adjacent isolation structures; and
each dummy gate structure is formed on the top surface of the isolation structure, on sidewalls of the fin, and on a top surface of the fin.

10. The method according to claim 1, wherein:
at least one side of the at least one third opening in the semiconductor substrate includes the stress layer.

11. The method according to claim 1, wherein:
both sides of the at least one third opening in the semiconductor substrate include the stress layers, and the stress layers at both sides of the at least one third opening is made of a same or a different material.

12. The method according to claim 1, wherein the step of forming the stress layer includes:
forming a fourth opening in the semiconductor substrate between the two adjacent dummy gate structures; and
using a selective epitaxial deposition process to form the stress layer in the fourth opening.

13. The method according to claim 12, wherein the step of forming the fourth opening between the two adjacent dummy gate structures includes:
using an anisotropic dry etch process to form the fourth opening; and
after the anisotropic dry etch process, using an anisotropic wet etch to etch each sidewall of the fourth opening to form a vertex angle on the sidewall of the fourth opening, wherein the vertex angle extends under an adjacent dummy gate structure in the semiconductor substrate, and the sidewall of the fourth opening forms a "Σ" shape with respect to a top surface of the semiconductor substrate.

14. The method according to claim 1, wherein each gate structure formed in the first opening includes:
a gate dielectric layer made of a high-K dielectric material; and
a gate electrode layer formed on the gate dielectric layer and filled in the first opening, wherein the gate electrode layer is made of a metal.

15. The method according to claim 14, wherein the step of removing the dummy gate electrode layers to form the first openings further includes:
removing a dummy gate dielectric layer formed between the semiconductor substrate and the dummy gate electrode layer after removing the dummy gate electrode layer to form the first openings, wherein the dummy gate dielectric layer is made of $SiO_2$ gate electrode layer; and
wherein the step of forming the gate structures in the first openings includes:
forming a gate dielectric film on the first dielectric layer and in the first openings;
forming a gate electrode film on the gate dielectric film; and
planarizing the gate dielectric film and the gate electrode film to expose a top surface of the first dielectric layer to form the gate dielectric layer on sidewall and bottom of each of the first openings and to form a gate electrode layer on the gate dielectric layer.

16. The method according to claim 14, wherein the step of removing the dummy gate electrode layers to form the first openings exposes a gate dielectric layer formed between the semiconductor substrate and the dummy gate electrode layer; and wherein the step of forming the gate structures in the first openings includes:
forming a gate electrode film on the first dielectric layer and in the first openings; and
planarizing the gate electrode film to expose a top surface of the first dielectric layer and to form the gate structure in the first opening.

17. A semiconductor device, comprising:
a semiconductor substrate including a plurality of active regions configured in parallel and an isolation region between adjacent active regions, isolation structures being in the isolation regions;
a plurality of functional gate structures formed on the semiconductor substrate;
stress layers formed in the semiconductor substrate on opposite sides of each functional gate structure;
a first dielectric layer on the semiconductor substrate, the stress layers, and sidewall spacers of each functional gate structure; and
a second dielectric layer on the first dielectric layer and filled in an opening, wherein the opening passes through the first dielectric layer and extends into the semiconductor substrate, and opposite sides of the opening connect to the stress layers in the semiconductor substrate,
wherein the second dielectric layer is formed by: providing a plurality of dummy gate structures on the isolation structures and the active regions that are in the semiconductor substrate, wherein each dummy gate structure includes a dummy gate electrode layer and a sidewall spacer on a sidewall surface of each dummy gate electrode layer; forming the stress layer between two adjacent dummy gate structures; forming the first dielectric layer on the semiconductor substrate, the stress layers, and the sidewall spacers of the plurality of dummy gate structures, wherein the first dielectric layer exposes the dummy gate electrode layers; removing the dummy gate electrode layers to form first openings in the first dielectric layer; forming gate structures in the first openings, wherein the gate structures include the plurality of functional gate structures and at least one non-functional gate structure; removing the at least one non-functional gate structure to form at least one second opening in the first dielectric layer; and forming at least one third opening in the semiconductor substrate at a bottom of the at least one second opening, wherein the opening filled with the second dielectric layer includes the at least one second opening and the at least one third opening.

18. The device according to claim 17, wherein the stress layers are made of SiGe or SiC.

19. The device according to claim 17, wherein the stress layers in the semiconductor substrate on the opposite sides of the second dielectric layer are made of a same or a different material.

* * * * *